US012666679B2

(12) United States Patent
Su et al.

(10) Patent No.: US 12,666,679 B2
(45) Date of Patent: Jun. 23, 2026

(54) SEMICONDUCTOR STRUCTURE WITH NITRIDED INNER SPACERS AND METHOD FOR MANUFACTURING THE SAME

(71) Applicant: TAIWAN SEMICONDUCTOR MANUFACTURING COMPANY, LTD., Hsinchu (TW)

(72) Inventors: Man-Nung Su, Hsinchu (TW); I-Hsuan Lo, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 608 days.

(21) Appl. No.: 18/154,614

(22) Filed: Jan. 13, 2023

(65) Prior Publication Data

US 2024/0136427 A1     Apr. 25, 2024

Related U.S. Application Data

(60) Provisional application No. 63/417,454, filed on Oct. 19, 2022.

(51) Int. Cl.

| | |
|---|---|
| *H10D 64/01* | (2025.01) |
| *H10D 30/01* | (2025.01) |
| *H10D 30/43* | (2025.01) |
| *H10D 30/67* | (2025.01) |
| *H10D 62/10* | (2025.01) |
| *H10D 64/66* | (2025.01) |
| *H10P 14/60* | (2026.01) |

(52) U.S. Cl.
CPC ......... *H10D 64/018* (2025.01); *H10D 30/014* (2025.01); *H10D 30/43* (2025.01); *H10D 30/6735* (2025.01); *H10D 62/121* (2025.01);
*H10D 64/017* (2025.01); *H10D 64/671* (2025.01); *H10P 14/6524* (2026.01); *H10P 14/6532* (2026.01)

(58) Field of Classification Search
CPC .......... H01L 21/02329; H01L 21/0234; H10D 30/6735; H10D 64/017; H10D 64/021
See application file for complete search history.

(56) References Cited

U.S. PATENT DOCUMENTS

| | | | | |
|---|---|---|---|---|
| 2018/0277656 | A1* | 9/2018 | Chao | .................... H01L 21/3065 |
| 2019/0267463 | A1* | 8/2019 | Chao | ....................... H10D 30/62 |
| 2020/0105929 | A1* | 4/2020 | Zhang | .................. H10D 64/017 |
| 2020/0127119 | A1* | 4/2020 | Lin | .................... H10D 30/6212 |

* cited by examiner

*Primary Examiner* — Brian Turner
(74) *Attorney, Agent, or Firm* — Birch, Stewart, Kolasch & Birch, LLP

(57) ABSTRACT

A semiconductor structure includes a channel structure, a gate structure, two source/drain features, and a plurality of inner spacers. The channel structure includes a plurality of channel features which are spaced apart from each other. The gate structure is disposed to surround the channel features. The source/drain features are disposed at two opposite sides of the channel structure such that each of the channel features interconnects the source/drain features. Each of the inner spacers is disposed to separate the gate structure from a corresponding one of the source/drain features. Each of the inner spacers includes an inner spacer body and a lateral nitrided portion. The lateral nitrided portion is in direct contact with the corresponding one of the source/drain features and has a nitrogen content greater than that of the inner spacer body.

20 Claims, 13 Drawing Sheets

41 nucleation inner spacer nucleation gate spacer nucleation

535

51 nucleation 43 43 43

432 91 92 432 91 92 432

70 70

431 431 431

531 { 535 421B
      532

421A 532 } 531
      535

421A 421B 421A 421B

422 { 523 } 55
          521

41

SEMICONDUCTOR STRUCTURE WITH NITRIDED INNER SPACERS AND METHOD FOR MANUFACTURING THE SAME

REFERENCE TO RELATED APPLICATION

This application claims priority of U.S. Provisional Application No. 63/417,454 filed on Oct. 19, 2022, the contents of which is incorporated herein by reference in its entirety.

BACKGROUND

Transistors are key active components in modern integrated circuits (ICs). With rapid development of semiconductor technology, critical dimension (CD) of transistors keeps shrinking, configuration of gate structure continues to evolve, and various three-dimensional (3D) transistor structures are springing up, making it possible to integrate a large number of transistors per unit area. There is a continuous need for improving the performance of the transistors in advanced node 3D ICs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2 to 15 illustrate schematic views of intermediate stages of the method depicted in FIG. 1 in accordance with some embodiments.

DETAILED DESCRIPTION

Figure 1:
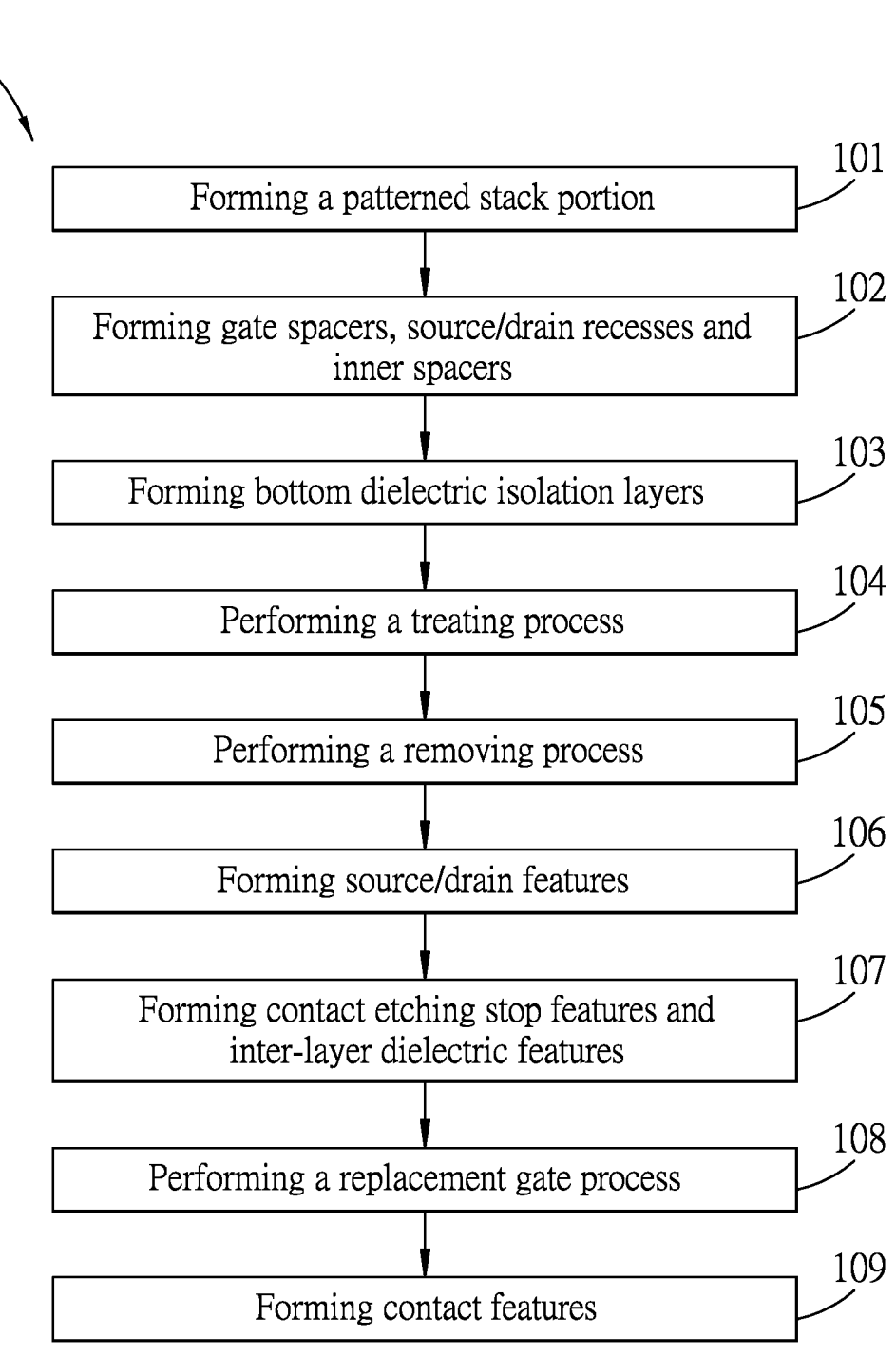
FIG. 1 is a flow diagram illustrating a method for manufacturing a semiconductor structure in accordance with some embodiments.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "on," "above," "top," "bottom," "upper," "lower," "over," "beneath," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

For a field-effect transistor (FET), the quality of source/drain features, which are epitaxially grown in some cases, is critical to the performance of the FET. For a nanosheet gate-all around FET (GAA FET), the growth temperature of the source/drain features may be lowered to promote absorption of precursor materials on inner spacers and sometimes on bottom dielectric isolations. However, the lowered temperature may also result in random nucleation on the gate spacers. A way to improve selectivity of epitaxial growth on the inner spacers and the bottom dielectric isolations relative to the gate spacers is to increase nitrogen content on the surfaces of the inner spacers and the bottom dielectric isolations. The nitrogen-containing terminal groups are more likely to react and bond with the epitaxial precursors.

FIG. 1 is flow diagram illustrating a method 100 for manufacturing a semiconductor structure (for example, a semiconductor structure 20 shown in FIG. 15) in accordance with some embodiments. FIGS. 2 to 15 illustrate schematic views of intermediate stages of the method 100 in accordance with some embodiments. Some repeating structures are omitted in FIGS. 2 to 15 for the sake of brevity.

Figure 2:
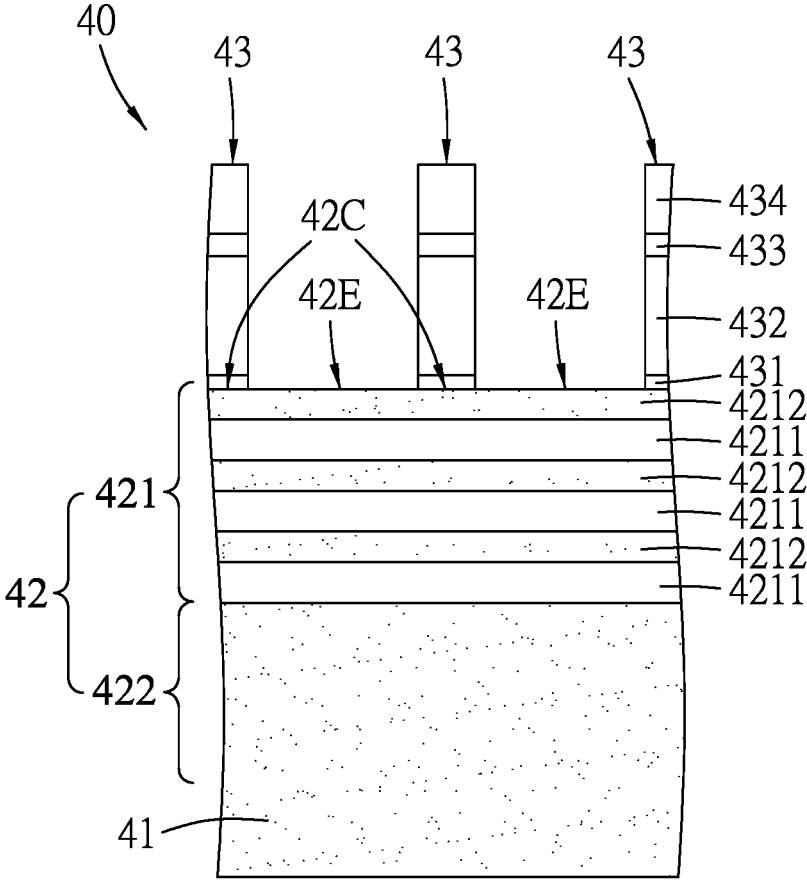
Figure 2:
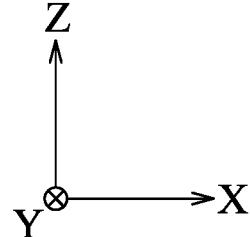
Figure 15:
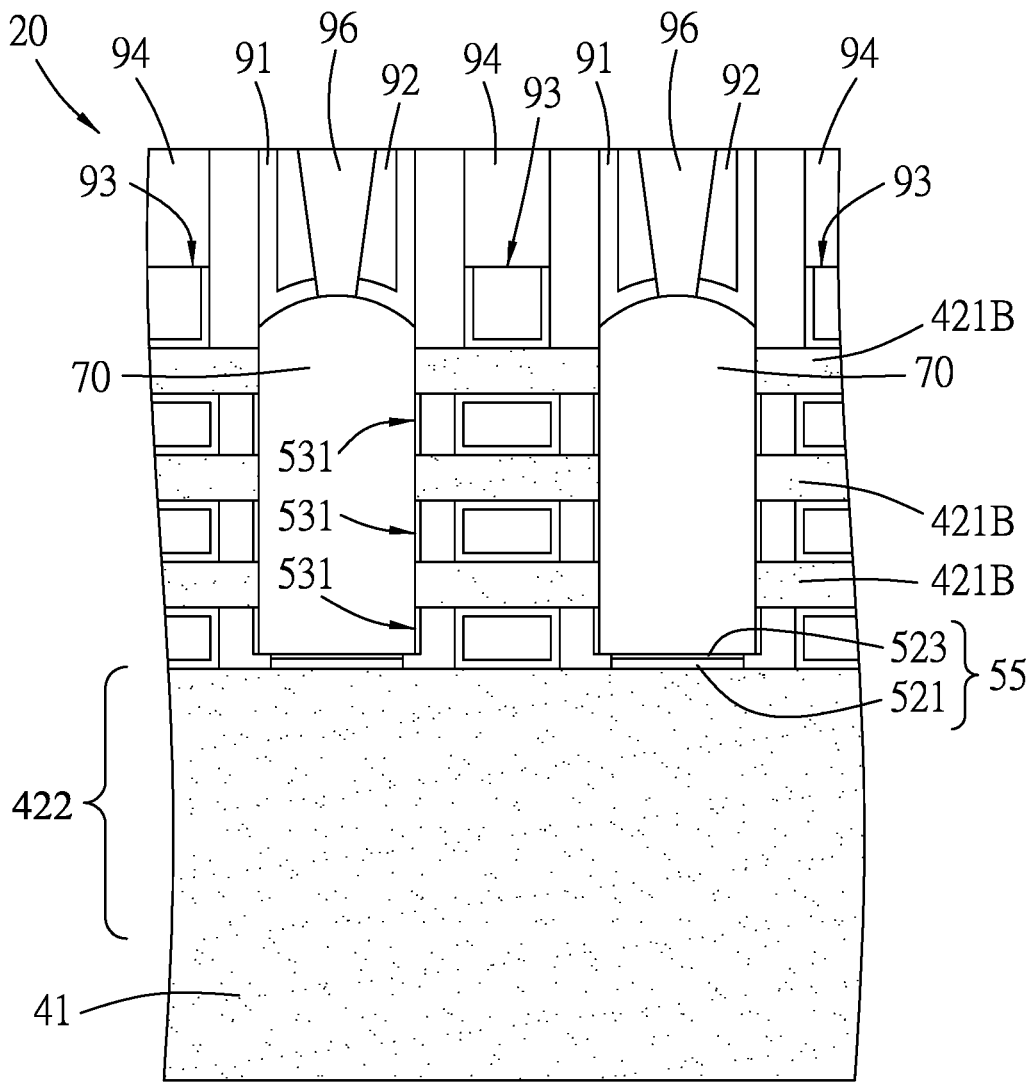
Figure 15:
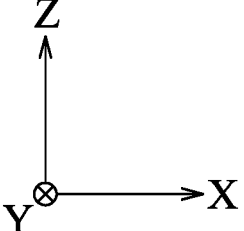

Referring to FIG. 1 and the example illustrated in FIG. 2, the method 100 begins at step 101, where a patterned stack portion 40 is formed. It should be noted that although the method 100 is exemplified by a method for manufacturing a GAA structure (for example, semiconductor structure 20 as shown in FIG. 15), the method 100 may be used for manufacturing other suitable structures, such as fork-sheet FETs, complementary FET (CFET) including at least two GAA FETs stacked on each other.

In some embodiments, as shown in FIG. 2, the patterned stack portion 40 includes a semiconductor substrate 41, a fin structure 42 disposed on the semiconductor substrate 41, and a plurality of dummy gate portions 43 extending in a Y direction over the fin structure 42 and spaced apart from each other in an X direction transverse to the Y direction.

In some embodiments, the semiconductor substrate 41 may be made of elemental semiconductor materials, such as crystalline silicon (Si), diamond, or germanium (Ge); compound semiconductor materials, such as gallium nitride (GaN), silicon carbide (SiC), gallium arsenide (GaAs), indium arsenide (InAs), or indium phosphide (InP); or alloy semiconductor materials, such as silicon germanium (SiGe), silicon germanium carbide, gallium arsenic phosphide (GaAsP), or gallium indium phosphide (GaInP). The material for forming the semiconductor substrate 41 may be doped with p-type impurities or n-type impurities, or undoped. In addition, the semiconductor substrate 41 may be a bulk silicon substrate, a silicon-on-insulator (SOI) substrate, or a germanium-on-insulator (GOI) substrate. Other suitable materials and/or configurations for the semiconductor substrate 41 are within the contemplated scope of the present disclosure.

In some embodiments, the fin structure 42 includes a stack portion 421 and a lower fin portion 422 disposed between the semiconductor substrate 41 and the stack portion 421. The stack portion 421 includes a plurality of sacrificial layers 4211 and a plurality of channel layers 4212 disposed to alternate with the sacrificial layers 4211 in a Z direction transverse to both the X and Y directions. In some embodiments, the X, Y, and Z directions are perpendicular to one another. In some embodiments, an uppermost one of the channel layers 4212 is disposed over an uppermost one of the sacrificial layers 4211. The number of the sacrificial layers 4211 and the channel layers 4212 in the stack portion 421 is determined according to application requirements. In FIG. 2, the number of each of the sacrificial layers 4211 and the channel layers 4212 is three.

The lower fin portion 422 may be made of a material the same as or different from that of the semiconductor substrate 41 as described above. In some embodiments, the lower fin portion 422 is made of Si. In some embodiments, the material for forming the lower fin portion 422 may be doped with p-type impurities or n-type impurities, or undoped.

The channel layers 4212 are made of a semiconductor material including first semiconductor elements. In some embodiments, the channel layers 4212 may be made from a material the same as or different from that of the semiconductor substrate 41. When the channel layers 4212 are made of elemental semiconductor materials, the first semiconductor elements may be Si, C or Ge. The sacrificial layers 4211 are made of a material which is different from that of the channel layers 4212, so that the sacrificial layers 4211 can be selectively removed with respect to the material of the channel layers 4212 during subsequent processes. In some embodiments, the channel layers 4212 are made of Si, and the sacrificial layers 4211 are made of SiGe. Since suitable materials for elements 421, 4211, 4212, 422 of the fin structure 42 are similar to those for the semiconductor substrate 41, the details thereof are omitted for the sake of brevity.

In some embodiments, the fin structure 42 has a pair of exposed regions 42E exposed from the dummy gate portions 43. The pair of exposed regions 42E is located at two sides of a corresponding one of the dummy gate portions 43, and is opposite to each other in the X direction.

In some embodiments, each of the dummy gate portions 43 may include a dummy gate dielectric 431, a dummy gate electrode 432, a polish stop layer 433, and a hard mask 434. The dummy gate dielectric 431 of each of the dummy gate portions 43 is disposed on a corresponding one of covering regions 42C of the fin structure 42. Each of the covering regions 42C is disposed between a corresponding pair of the exposed regions 42E. The dummy gate electrode 432, the polish stop layer 433, and the hard mask 434 are sequentially disposed on the dummy gate dielectric 431 opposite to the corresponding covering region 42C. In some embodiments, each of the hard mask 434 and the polish stop layer 433 may independently include silicon nitride, silicon oxide, silicon oxynitride, or combinations thereof, the dummy gate electrode 432 may include polycrystalline silicon, single crystalline silicon, amorphous silicon, or combinations thereof, and the dummy gate dielectric 431 may include silicon oxide, silicon nitride, silicon oxynitride, high dielectric constant (k) materials, or combinations thereof. Other suitable materials for the dummy gate portions 43 are within the contemplated scope of the present disclosure.

In some embodiments, the patterned stack portion 40 further includes two isolation portions (not shown) disposed on the semiconductor substrate 41 and located at two opposite sides of the lower fin portion 422 of the fin structure 42 which are opposite to each other in the Y direction so as to isolation the fin structure 42 from an adjacent semiconductor structure (not shown). In some embodiments, each of the isolation portions may be a portion of a shallow trench isolation (STI), a deep trench isolation (DTI), or other suitable structures, and may be made of an oxide material (for example, silicon oxide), a nitride-based material (for example, silicon nitride), or a combination thereof. Other suitable materials and/or configurations for the isolation portions are within the contemplated scope of the present disclosure. In some embodiments, each of the dummy gate portions 43 is further disposed on the isolation portions.

In some embodiments, the patterned stack portion 40 may be formed by (i) patterning a substrate and a stack (not shown) formed thereon to form the fin structure 42 on the semiconductor substrate 41 (the substrate is patterned into the semiconductor substrate 41 and the lower fin portion 422 of the fin structure 42, and the stack is patterned into the stack portion 421 of the fin structure 42), (ii) forming an isolation layer over the semiconductor substrate 41 and the fin structure 42 followed by a planarization process, for example, but not limited to, chemical mechanism polishing (CMP), to form two isolation regions at two opposite sides of the fin structure 42, (iii) recessing the isolation regions to form the isolation portions so as to expose the stack portion 421 of the fin structure 42, and (iv) forming the dummy gate portions 43 respectively over the covering regions 42C of the fin structure 42 to expose the exposed regions 42E of the fin structure 42 from the dummy gate portions 43. Other suitable processes for forming the patterned stack portion 40 are within the contemplated scope of the present disclosure.

Figure 3:
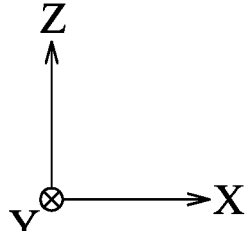

Referring to FIG. 1 and the example illustrated in FIG. 3, the method 100 proceeds to step 102, where a plurality of gate spacers 51, a plurality of source/drain recesses 52 and a plurality pairs of inner spacers 531 are formed. FIG. 3 is a view similar to that of FIG. 2, but illustrating the structure after step 102.

In some embodiments, step 102 may include sub-steps 1021 to 1024.

In sub-step 1021, each pair of the gate spacers 51 are respectively formed at the two opposite sides of a corresponding one of the dummy gate portions 43 in the X direction. In some embodiments, each of the gate spacers 51 may be formed as a single layer structure as shown in FIG. 3 or a multi-layered structure (not shown) according to practical requirements. In some embodiments, the gate spacers 51 may be formed by conformally depositing a dielectric material (not shown) over the structure shown in FIG. 2 using, for example, chemical vapor deposition (CVD), atomic layer deposition (ALD), or other suitable deposition techniques, followed by an anisotropic dry etching process until portions of the dielectric material, which is formed on upper surfaces of the exposed regions 42E (see FIG. 2) and an upper surface of each of the dummy gate portions 43, are removed such that the remaining dielectric material serve as the gate spacers 51, each pair of which are selectively formed at the two opposite sides of the corresponding dummy gate portion 43. In some embodiments, the dielectric materials for forming the gate spacers 51 may include silicon oxide, silicon nitride, silicon oxynitride, silicon carbon nitride, silicon oxycarbonnitride, low dielectric constant (k) materials, but is not limited thereto. Other suitable materials for the gate spacers 51 are within the contemplated scope of the present disclosure.

In sub-step 1022, the exposed regions 42E (see FIG. 2) of the fin structure 42 are etched away to form the source/drain recesses 52, respectively, by dry etching, wet etching, other suitable processes, or combinations thereof. After sub-step 1022, the sacrificial layers 4211 and the channel layers 4212 (see FIG. 2) are respectively patterned into sacrificial features (not shown) and channel features 421B. The channel features 421B obtained from the channel layers 4212 include the first semiconductor elements. In some embodiments, the first semiconductor elements are Si. In some embodiments, each of the channel features 421B includes two end portions 421C opposite each other along the X direction. Each of the end portions 421C of each of the channel features 421B is exposed from a corresponding one of the source/drain recesses 52. In some embodiments, each of the sacrificial features includes a major portion 534 and two end portions (not shown) which are disposed at two opposite sides of the major portion 534.

In sub-step 1023, the end portions of the sacrificial features are removed through the source/drain recesses 52 to form lateral recesses (not shown) by an isotropic etching process, such as wet etching, or other suitable etching techniques. After sub-step 1023, the remaining sacrificial features are denoted by 421A.

In sub-step 1024, the inner spacers 531 are respectively formed in the lateral recesses and the inner spacers 531 in each pair respectively cover two opposite ends of the major portion 534 of a corresponding one of the remaining sacrificial features 421A. Thus, by sub-steps 1023 and 1024, the end portions of the sacrificial features are replaced with the inner spacers 531. In some embodiments, the inner spacers 531 may be formed by (i) depositing a dielectric material (not shown) for forming the inner spacers 531 on the structure obtained after sub-step 1023 so as to fill the lateral recesses by CVD, ALD, or other suitable deposition techniques, and (ii) removing excess portions of the dielectric material for forming the inner spacers 531 by an etching process, for example, but not limited to, a wet etching process, a dry etching process, other suitable etching techniques, or combinations thereof, such that the inner spacers 531 are respectively formed in the lateral recesses. In some embodiments, the dielectric material for forming the inner spacers 531 includes silicon oxide, silicon nitride, silicon oxynitride, other suitable dielectric materials, or combinations thereof. Other dielectric materials suitable for forming the inner spacers 531 are within the contemplated scope of the present disclosure. In some embodiments, each of the inner spacers 531 includes a lateral portion 533 and an inner spacer body 532 disposed between the lateral portion 533 and the major portion 534 of the corresponding one of the remaining sacrificial features 421A. Other suitable processes for performing step 102 are within the contemplated scope of the present disclosure.

Figure 4:
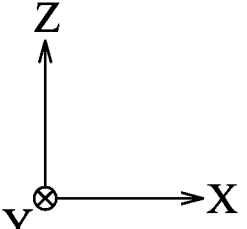

Referring to FIG. 1 and the example illustrated in FIG. 4, the method 100 proceeds to step 103, where a plurality of bottom dielectric isolation layers 55 are respectively formed in the source/drain recesses 52. FIG. 4 is a view similar to that of FIG. 3, but illustrating the structure after step 103. In some embodiments, the bottom dielectric isolation layers 55 are each provided for reducing a leakage current which flows from a corresponding one of source/drain features 70 (see FIG. 13) to an adjacent element through the lower fin portion 422.

In some embodiments, the bottom dielectric isolation layers 55 may be made of a dielectric material similar to those for forming the inner spacers 531. In some embodiments, the bottom dielectric isolation layers 55 are made of silicon nitride. In some embodiments, introduction of the bottom dielectric isolation layers 55 may also reduce the occurrence of the leakage current due to an insulating property of the bottom dielectric isolation layers 55. In some embodiments, each of the bottom dielectric isolation layers 55 includes an isolation body 521 which is disposed on the lower fin portion 422, and an upper portion 522 which is disposed on the isolation body 521.

In some embodiments, the bottom dielectric isolation layers 55 may be formed by (i) depositing the dielectric material for forming the bottom dielectric isolation layers 55 on the structure shown in FIG. 3 by CVD, ALD or other suitable deposition techniques, and (ii) removing excess portions of the dielectric material for forming the bottom dielectric isolation layers 55 by an etching process, for example, but not limited to, a wet etching process, a dry etching process, other suitable etching techniques, or combinations thereof, such that the remaining dielectric material serves as the bottom dielectric isolation layers 55 which are respectively formed on bottom surfaces of the source/drain recesses 52. Other suitable processes for forming the bottom dielectric isolation layers 55 are within the contemplated scope of the present disclosure.

Figure 5:
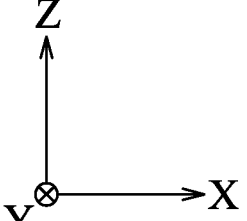

Referring to FIG. 1 and the example illustrated in FIG. 5, the method 100 proceeds to step 104, where a treating process is performed. In some embodiments, the treating process is an atomic pretreatment. In some embodiments, the treating process involves introducing nitrogen into the inner spacers 531 so as to convert the lateral portion 533 of each of the inner spacers 531 shown in FIG. 4 into a lateral nitrided portion 535 which has a nitrogen content greater than that of the inner spacer body 532. In some embodiments, the upper portion 522 of each of the bottom dielectric isolation layers 55 shown in FIG. 4 is also nitrided, and is converted into an upper nitrided portion 523 which is connected between the isolation body 521 and a corresponding one of the to-be-formed source/drain features 70 (see FIG. 15) and which has a nitrogen content greater than that of the isolation body 521. In some embodiments, each of the end portions 421C of the channel features 421B shown in FIG. 4 is also nitrided, and is converted into a nitrogen-introduced end portions 421D. In some embodiments, an outer portion 511 of each of the gate spacers 51 shown in FIG. 4 is also nitrided, and is converted into a nitrogen-introduced outer portion 512.

Figure 6:
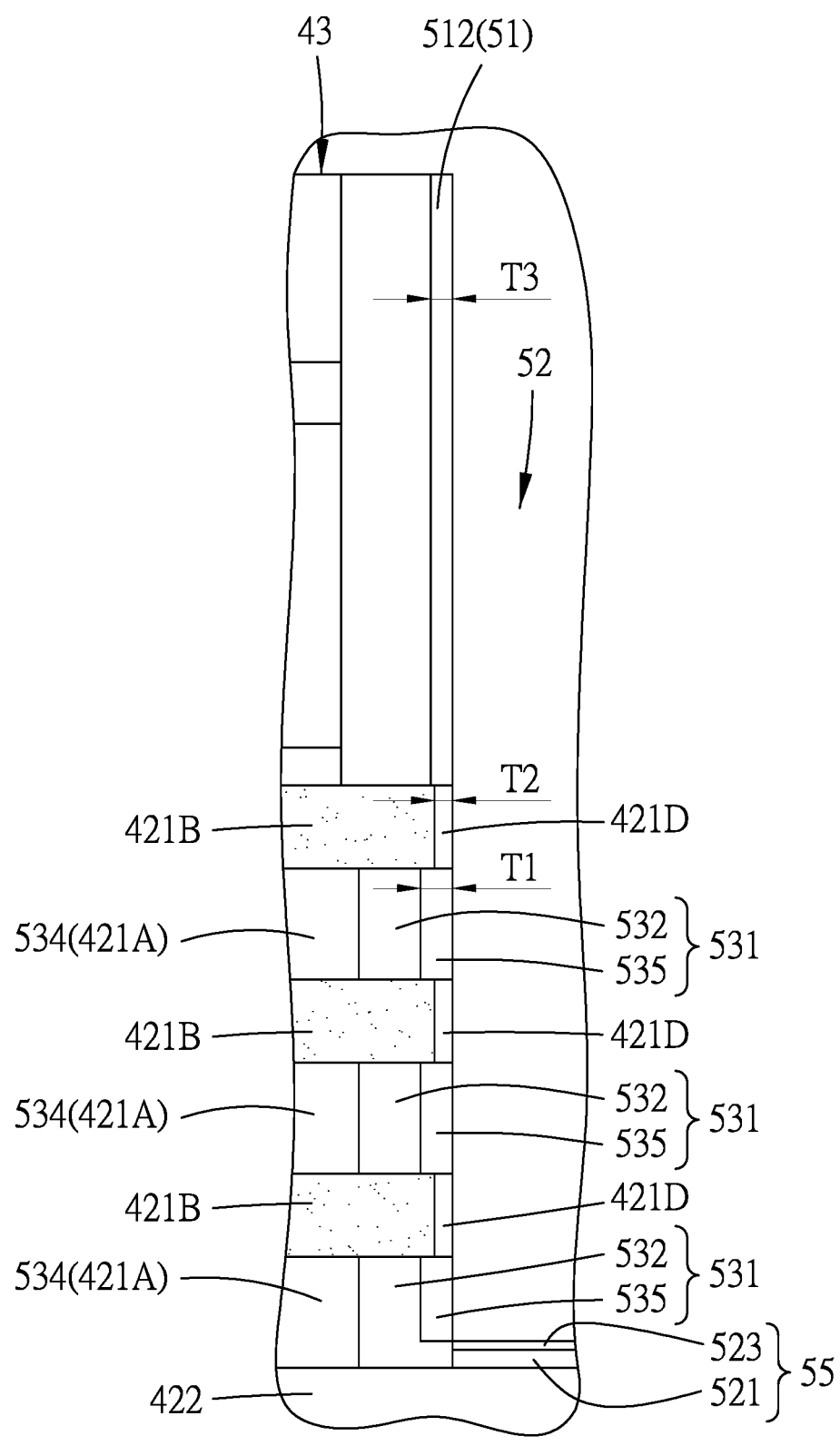

Referring to FIGS. 5 and 6, where FIG. 6 is an enlarged view of block (B) shown in FIG. 5, the lateral nitrided portion 535 of each of the inner spacers 531 has a first thickness (T1), each of the nitrogen-introduced end portions 421D of the channel features 421B has a second thickness (T2), and the nitrogen-introduced outer portion 512 of each of the gate spacers 51 has a third thickness (T3). In some embodiments, the first thickness (T1) is greater than the second thickness (T2) and the third thickness (T3).

In some embodiments, the treating process may involve a treatment with a nitrogen-containing plasma, such as microwave (MW) plasma, electron cyclotron resonance (ECR) plasma, capacitively coupled plasma (CCP), inductively coupled plasma (ICP), very high frequency (VHF) plasma, other suitable types of plasma, or any combination thereof. In some embodiments, the plasma treating process may be performed in a single-step or multiple steps (i.e., involving multiple steps of plasma treatment and multiple steps of purge alternating with each other), according to practical requirements. In some embodiments, the nitrogen source for the treating process may be nitrogen-containing ions (e.g., N or $N_2$ ions), nitrogen-containing radicals (e.g., ·N, ·$N_2$ radicals), nitrogen-and-hydrogen-containing ions (e.g., NH, $NH_2$, $NH_3$, ions), nitrogen-and-hydrogen-containing radicals (e.g., ·NH, ·$NH_2$, ·$NH_3$ radicals), other suitable sources, or any combination thereof. In some embodiments, diluted gas (e.g., carrier gas) may be introduced to mix with the nitrogen source, and may be argon (Ar), helium (He), hydrogen ($H_2$), neon (Ne), krypton (Kr), xenon (Xe), other suitable types of gas, or any combination thereof. In some embodiments, the plasma process pressure may range from about 1 mTorr to about 30 Torr, but other ranges of values are also within the scope of this disclosure. If the plasma process pressure is too low or too high, such as lower than about 1 mTorr or higher than about 30 Torr, the plasma may not be able to be generated. For example, the plasma process pressure may be in the range of a few mTorr to about 3 Torr for MW plasma or ECR plasma; the plasma process pressure may be in the range of a few mTorr to about 10 Torr for VHF plasma; the plasma process pressure may be in the range of about 1 Torr to about 22 Torr for CCP or ICP. In some embodiments, the plasma process temperature may range from about 0° C. to about 800° C., but other ranges of values are also within the scope of this disclosure. In some embodiments, the plasma process temperature is not required to be lower than 0° C. If the plasma process temperature is too high, such as higher than about 800° C., ambient elements/devices may be adversely affected. For example, the plasma process temperature may be in the range of about 200° C. to about 500° C. for MW plasma; the plasma process temperature may be in the range of about 0° C. to about 200° C. for ECR plasma; the plasma process temperature may be in the range of about 300° C. to about 700° C. for CCP or ICP. In some embodiments, the plasma process power may range from about 500 W to about 8000 W, but other ranges of values are also within the scope of this disclosure. If the plasma process power is too low, such as lower than about 500 W, the plasma may not be properly generated. If the plasma process power is too high, such as higher than about 8000 W, the elements exposed to the plasma may be damaged. In some embodiments, the plasma process time may range from about 15 seconds to about 900 seconds, but other ranges of values are also within the scope of this disclosure. If the plasma process time is too low, such as lower than about 15 seconds, the plasma treatment uniformity may be unsatisfactory. If the plasma process time is too long, such as longer than about 900 seconds, the product throughput may be adversely affected.

In some embodiments, the density of the inner spacer body 532 and the lateral portion 533 of each of the inner spacers 531 shown in FIG. 3 may range from about 1.6 $g/cm^3$ to about 2.3 $g/cm^3$, but other ranges of values are also within the scope of this disclosure, and the density of each of the gate spacers 51 is higher than that of the inner spacer body 532 and the lateral portion 533 of each of the inner spacers 531, such that the first thickness (T1) of the lateral nitrided portion 535 of each of the inner spacers 531 shown in FIG. 6 is greater than the third thickness (T3) of the nitrogen-introduced outer portion 512 of each of the gate spacers 51 because nitrogen tends to penetrate deeper into a material with a lower density. If the density of the inner spacer body 532 and the lateral portion 533 of each of the inner spacers 531 is too low, such as lower than about 1.6 $g/cm^3$, the inner spacers 531 may not be able to withstand subsequent processes. If the density of the inner spacer body 532 and the lateral portion 533 of each of the inner spacers 531 is too high, such as higher than about 2.3 $g/cm^3$, the dielectric constant value (i.e., k-value) of the inner spacers 531 may be too high, negatively affecting device performance. In some embodiments, the difference in density between the inner spacers 531 and the gate spacers 51 shown in FIGS. 3 and 4 may be higher than about 0.2 $g/cm^3$, but other ranges of values are also within the scope of this disclosure.

In some embodiments, each of the inner spacers 531 and the gate spacers 51 may be made of an oxide-based dielectric material (e.g., SiOC:H, SiCO:H, SIONC:H, SIOCN:H, etc.), a nitride-based material (e.g., SINC:H, SICN:H, SINCO:H, etc.), other suitable dielectric materials, or any combination thereof. In some embodiments, the nitrogen content of the lateral nitrided portion 535 of each of the inner spacers 531 may range from about 10 atomic % to about 45 atomic %, but other ranges of values are also within the scope of this disclosure. If the nitrogen content of the lateral nitrided portion 535 of each of the inner spacers 531 is too low, such as lower than about 10 atomic %, the inner spacers 531 may not be able to withstand subsequent processes. If the nitrogen content of the lateral nitrided portion 535 of each of the inner spacers 531 is too high, such as higher than about 45 atomic %, the dielectric constant value (i.e., k-value) of the inner spacers 531 may be too high, negatively affecting device performance. In some embodiments, the ratio of nitrogen atoms to silicon atoms in the lateral nitrided portion 535 of each of the inner spacers 531 may range from about 0.33 to about 1.5, but other ranges of values are also within the scope of this disclosure. If the ratio is too high, such as higher than about 1.5, the density of the inner spacers 531 may be too high. If the ratio is too low, such as lower than about 0.33, the density of the inner spacers 531 may be too low. Other suitable processes for performing step 104 are within the contemplated scope of the present disclosure.

Figure 7:
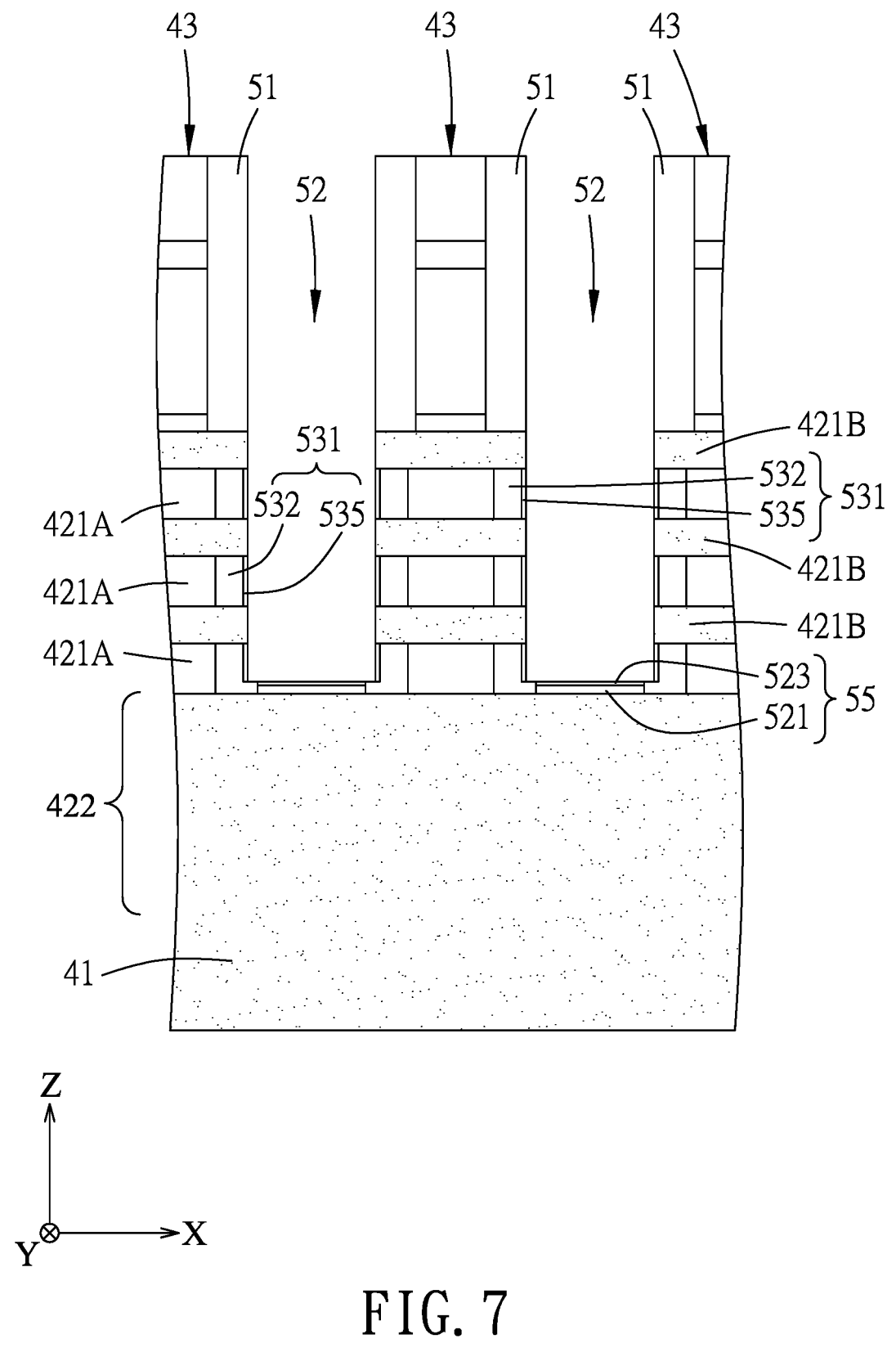

Referring to FIG. 1 and the example illustrated in FIG. 7, the method 100 proceeds to step 105, where a removing process is performed. FIG. 7 is a view similar to that of FIG. 5, but illustrating the structure after step 105.

In some embodiments, the removing process is conducted to etch the nitrogen-introduced outer portion 512 of each of the gate spacers 51, the nitrogen-introduced end portions 421D of each of the channel features 421B, the lateral nitrided portion 535 of each of the inner spacers 531, and the upper nitrided portion 523 of each of the bottom dielectric isolation layers 55. The removing process is terminated when the nitrogen-introduced end portions 421D of the channel features 421B and the nitrogen-introduced outer portion 512 of each of the gate spacers 51 are completely removed. In some embodiments, since the second thickness (T2) of the nitrogen-introduced end portions 421D of each of the channel features 421B and the third thickness (T3) of the nitrogen-introduced outer portion 512 of each of the gate spacers 51 are both smaller than the first thickness (T1) of the lateral nitrided portion 535 of each of the inner spacers 531, portions of the lateral nitrided portion 535 of each of the inner spacers 531 would be left unetched after the nitrogen-introduced end portions 421D of the channel features 421B and the nitrogen-introduced outer portion 512 of each of the gate spacers 51 are completely removed. In some embodiments, a ratio of the first thickness (T1) to the third thickness (T3) may range from about 1.2 to about 10, but other ranges of values are also within the scope of this disclosure. It should be noted that, such ratio may also be referred to as the treatment depth ratio for the lateral nitrided portion 535 of each of the inner spacers 531 and the nitrogen-introduced outer portion 512 of each of the gate spacers 51. That is, in comparison with the hate spacers 51, nitrogen penetrates 1.2 times to 10 times deeper in the inner spacers 531. If the ratio is too low, such as lower than about 1.2, the values of the first thickness (T1) and the third thickness (T3) are too close, causing the remaining lateral nitrided portion 535 of each of the inner spacers 531 after the removing process may be too thin. If the ratio is too high, such as higher than about 10, the first thickness (T1) may be too high, causing the remaining lateral nitrided portion 535 of each of the inner spacers 531 to be too thick and the overall dielectric constant (i.e., k-value) of the inner spacers 531 is increased. In some embodiments, the first thickness (T1) of the lateral nitrided portion 535 of each of the inner spacers 531 may range from about 0.5 nm to about 30 nm (may range from about 0.5 nm to about 3 nm in some embodiments), but other ranges of values are also within the scope of this disclosure. If the first thickness (T1) is too small, such as smaller than about 0.5 nm, the remaining lateral nitrided portion 535 of each of the inner spacers 531 after the removing process may be too thin. If the first thickness (T1) is large, such as larger than about 30 nm, the remaining lateral nitrided portion 535 of each of the inner spacers 531 to be too thick and the overall dielectric constant (i.e., k-value) of the inner spacers 531 is increased. After step 105, in some embodiments, a nitrogen content of the remaining lateral nitrided portion 535 of each of the inner spacers 531 is greater than a nitrogen content of each of the remaining channel features 421A and a nitrogen content of each of the remaining gate spacers 51. In some embodiments, a nitrogen content of the remaining upper nitrided portion 523 of each of the bottom dielectric isolation layers 55 is greater than a nitrogen content of each of the remaining channel features 421A and a nitrogen content of each of the remaining gate spacers 51.

In some embodiments, the removing process may involve the use of remote plasma chemical dry etch with a $NF_3/NH_3$ plasma. In some embodiments, plasma process power may be greater than 0 W and not greater than about 72 W, according to practical requirements. In some embodiments, plasma process time may range from about 6 seconds to about 10 seconds, according to practical requirements. In some embodiments, plasma process pressure may be not greater than about 10 Torr, according to practical requirements. In some embodiments, in order to increase an etching selectivity of a nitrogen containing material in the elements 512, 421D, 535 and 523 relative to other elements, the gas flow of $NF_3$ may range from about 0 sccm to about 150 sccm, and the gas flow of $NH_3$ may range from about 0 sccm to about 300 sccm, according to practical requirements. In some embodiments, the removing process may be performed in a single-step or multiple steps (i.e., involving multiple steps of plasma dry etching and multiple steps of heat treatment alternating with each other, where the heat treatment may be used for removing byproducts generated during etching), according to practical requirements. Other suitable processes for performing step 105 are within the contemplated scope of the present disclosure.

Figure 8:
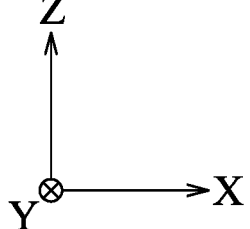

Referring to FIG. 1 and the example illustrated in FIG. 8, the method 100 proceeds to step 106, where a plurality of source/drain features 70 are respectively formed in the source/drain recesses 52 and respectively over the bottom dielectric isolation layers 55. In some embodiments, the source/drain features 70 are spaced apart from each other along the X direction, and are interconnected by the channel features 421B denoted in FIG. 8. In addition, the lateral nitrided portion 535 of each of the inner spacers 531 is in direct contact with a corresponding one of the source/drain features 70. It is noted that each of the source/drain features 70 may refer to a source or a drain, individually or collectively dependent upon the context. After step 106, the remaining lateral nitrided portion 535 of each inner spacers 531 is in direct contact with a corresponding one of the source/drain features 70.

In some embodiments, each of the source/drain features 70 may be formed by an epitaxial growth process involving CVD, molecular-beam epitaxy (MBE), an epitaxial deposition/partial etch process, such as a cyclic deposition-etch (CDE) process and/or a selective epitaxial growth (SEG) process, but is not limited thereto. In some embodiments, the growth temperature may be in the range of about 350° C. to about 1050° C., according to practical requirements. In some embodiments, the growth pressure may be in the range of about 10 Torr to about 300 Torr, according to practical requirements. In some embodiments, the flow rate of a precursor for growing the source/drain features 70 may be not greater than about 500 sccm, according to practical requirements. In some embodiments, the precursor may be silane ($SiH_4$), disilane ($Si_2H_6$), dichlorosilane (DSC) other suitable materials, or any combination thereof. In some embodiments, a suitable doping material (e.g., $PH_3$, $BH_3$, $BCl_3$, $AsH_3$, etc.) may be introduced with the precursor for forming the source/drain features 70 with a suitable doping type. In some embodiments, the process time for forming the source/drain features 70 may be in a range from seconds to hours, according to practical requirements. Other suitable processes for performing step 106 are within the contemplated scope of the present disclosure.

Figure 9:
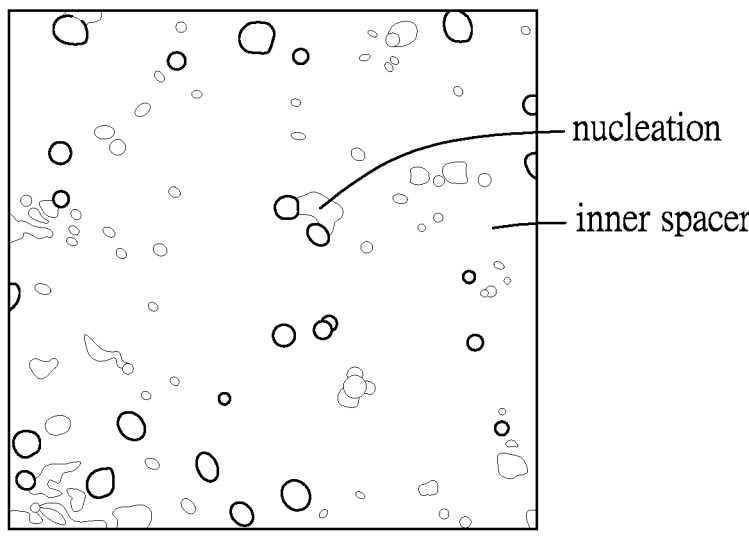
Figure 10:
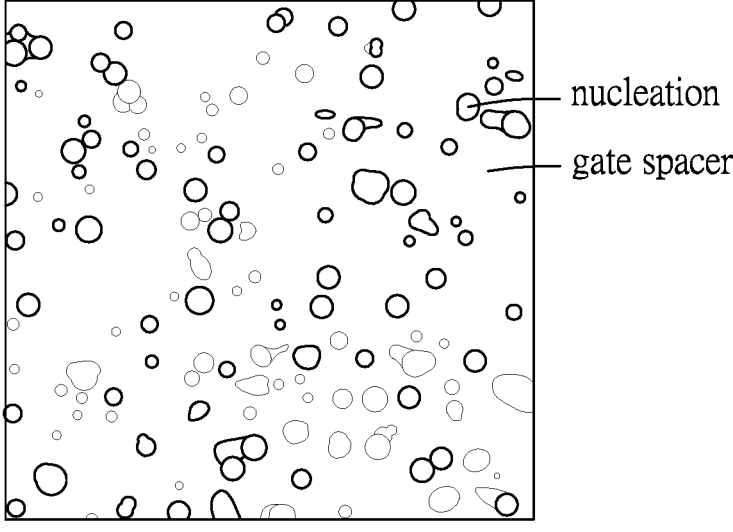
Figure 11:
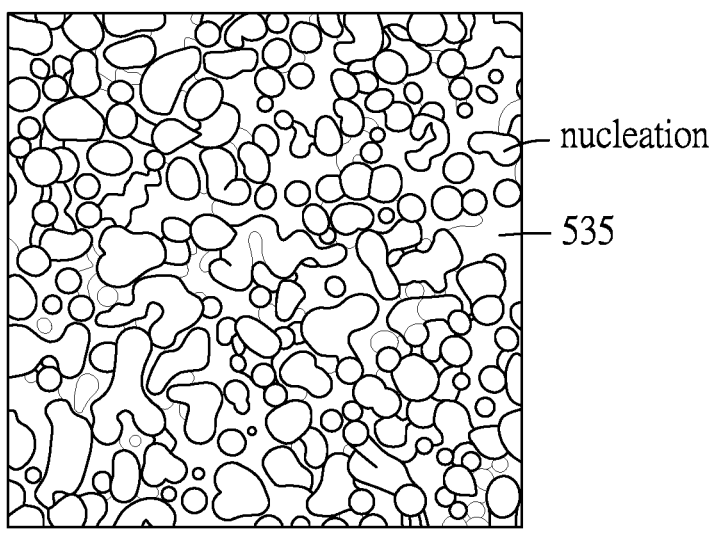
Figure 12:
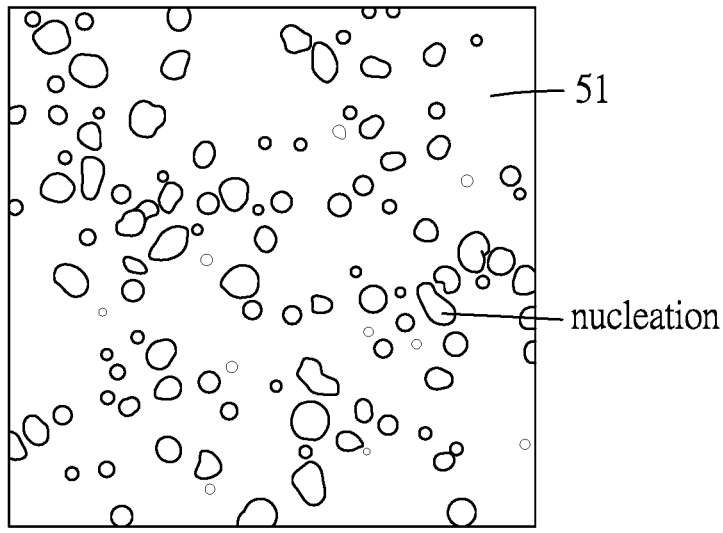

FIG. 9 is a schematic view in accordance with some embodiments, illustrating a surface of one of the inner spacers after step 106 when the treating process in step 104 is not performed (i.e., the lateral nitrided portion 535 is not formed). FIG. 10 is a schematic view in accordance with some embodiments, illustrating a surface of one of the gate spacers after step 106 when the treating process in step 104 is not performed (i.e., the nitrogen-introduced outer portion 512 is not formed). It can be observed that the precursor for forming the source/drain features 70 has similar amount of nucleation on the one of the inner spacer shown in FIG. 9 and on the one of the gate spacers shown in FIG. 10. FIG. 11 is a schematic view in accordance with some embodiments, illustrating a surface of the remaining lateral nitrided portion 535 of one of the inner spacers 531 shown in FIG. 7 which is being covered after step 106 when the treating process in step 104 is performed. FIG. 12 is a schematic view in accordance with some embodiments, illustrating a surface of one of the remaining gate spacers 51 shown in FIG. 7 when the treating process in step 104 is performed. It can be observed that the precursor for forming the source/drain features 70 readily nucleates on the surface of the remaining lateral nitrided portion 535 of the one of the inner spacers 531, while less nucleation is observed on the one of the remaining gate spacers 51. These figures show that the precursor for forming the source/drain features 70 tends to nucleate on a nitrogen-rich surface (i.e., the remaining lateral nitrided portion 535 of each of the inner spacers 531), and would not be prone to nucleate on the remaining gate spacers 51 since the nitrogen-introduced outer portions 512 are removed, thereby reducing the possibility of voids/defects formation in the resulting source/drain features 70 and also suppressing random nucleation of the precursor for forming the source/drain features 70 on the remaining gate spacers 51 (such random nucleation may be referred to as nodules in some embodiments). That is, the deposition selectivity of the precursor for forming the source/drain features 70 on the inner spacers 531 relative to the gate spacers 51 is increased.

Figure 13:
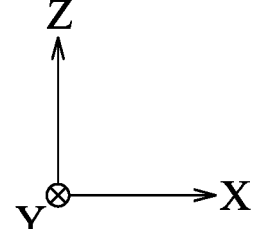

Referring to FIG. 1 and the example illustrated in FIG. 13, the method 100 proceeds to step 107, where a plurality of contact etching stop features 91 and a plurality of inter-layer dielectric (ILD) features 92 are respectively and sequentially formed on the source/drain features 70. FIG. 13 is a view similar to that of FIG. 8, but illustrating the structure after step 107.

In some embodiments, step 107 is performed by sequentially depositing a contact etching stop layer (not shown) and an ILD layer (not shown) sequentially over the structure shown in FIG. 8 using a blanket deposition process, such as, but not limited to, CVD or other suitable techniques, followed by a planarization process, for example, but not limited to, CMP, thereby removing the hard mask 434 and the polish stop layer 433 of each of the dummy gate portions 43 shown in FIG. 8 and exposing the dummy gate electrode 432. Thereafter, the contact etching stop layer is formed into the contact etching stop features 91 and the ILD layer is formed into the ILD features 92. In some embodiments, the contact etching stop layer for forming the contact etching stop features 91 may include, for example, but not limited to, silicon nitride, carbon-doped silicon nitride, other suitable materials, or combinations thereof. In some embodiments, the inter-layer dielectric layer for forming the ILD features 92 may include a dielectric material such as, but not limited to, silicon oxide, silicon nitride, silicon oxynitride, other suitable materials, or combinations thereof. Other suitable materials for forming the contact etching stop features 91 and the inter-layer dielectric features 92 are within the contemplated scope of the present disclosure.

Figure 14:
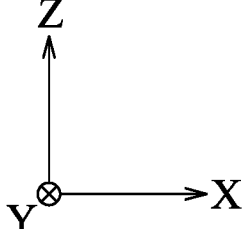

Referring to FIG. 1 and the example illustrated in FIG. 14, the method 100 proceeds to step 108, where a replacement gate process is performed such that the remaining dummy gate portions 43 and the remaining sacrificial features 421A shown in FIG. 13 are replaced with a plurality of gate structures 93 each including a gate dielectric layer 931 and a gate feature 932 formed on the gate dielectric layer 931. FIG. 14 is a view similar to that of FIG. 13, but illustrating the structure after step 108.

In some embodiments, step 108 includes (i) removing the dummy gate electrode 432 and the dummy gate dielectric layer 431 of each of the remaining dummy gate portions 43 and removing the remaining sacrificial features 421A to form a plurality of cavities (not shown) using dry etching, wet etching, other suitable processes, or combinations thereof, (ii) sequentially depositing materials for forming the gate dielectric layer 931 and the gate feature 932 to fill the cavities by a blanket deposition process, such as ALD, CVD, or other suitable techniques, and (iii) performing a planarization process, for example, but not limited to, CMP, to remove excesses of the materials for forming the gate feature 932 and the gate dielectric layer 931 and to expose the ILD features 92, and (iv) etching back the materials for forming the gate feature 932 and the gate dielectric layer 931 using for example, but not limited to, dry etching, wet etching, other suitable processes, or combinations thereof, thereby obtaining the gate structures 93 respectively in the cavities.

In some embodiments, the gate dielectric layer 931 includes silicon oxide, silicon nitride, silicon oxynitride, high dielectric constant (k) materials (such as hafnium oxide $(HfO_x)$, zirconium oxide $(ZrO_x)$, hafnium silicon oxide $(HfSiO_x)$, but is not limited thereto), other suitable materials, or combinations thereof. Other suitable materials for the gate dielectric layer 931 are within the contemplated scope of the present disclosure. In some embodiments, the gate feature 932 may be configured as a multi-layered structure including at least one work function metal which is provided for adjusting threshold voltage of the semiconductor structure 20 (see FIG. 15), an electrically conductive material having a low resistance which is provided for reducing electrical conductivity of the gate feature 932, other suitable materials, or combinations thereof. Other suitable methods for adjusting the threshold voltages are within the contemplated scope of the present disclosure. In some embodiments, the gate feature 932 includes a metal material (e.g., tungsten (W), titanium (Ti), tantalum (Ta), aluminum (Al), or ruthenium (Ru)), metal-containing nitrides (e.g., titanium nitride (TiN), or tantalum nitride (TaN)), metal-containing silicides (e.g., nickel silicide (NiSi)), metal-containing carbides (e.g., tantalum carbide (TaC)), or combinations thereof. Other suitable materials for the gate feature 932 are within the contemplated scope of the present disclosure.

In some embodiments, step 108 further includes depositing a dielectric material for forming a plurality of self-aligned dielectric features 94 on the structure obtained after formation of the gate feature 932 and the gate dielectric layer 931 using a blanket deposition process, such as, but not limited to, CVD, ALD, or other suitable deposition techniques, followed by a planarization process, for example, but not limited to, CMP, or other suitable processes, to expose the ILD features 92, thereby obtaining the self-aligned dielectric features 94 respectively disposed on the gate structures 93. Other suitable processes for performing step 108 are within the contemplated scope of the present disclosure.

After step 108, as shown in FIG. 14, the gate feature 932 is formed to surround the channel features 421B, and the gate dielectric layer 931 is formed to separate the gate feature 932 from the channel features 421B and the inner spacers 531.

Referring to FIG. 1 and the example illustrated in FIG. 15, the method 100 proceeds to step 109, where contact features 96 are respectively formed on the source/drain features 70. FIG. 15 is a view similar to that of FIG. 14, but illustrating the structure after step 109.

In some embodiments, step 109 includes (i) forming a patterned mask (not shown) on the structure after step 108, (ii) performing an etching process (for example, but not limited to, dry etching, wet etching, or a combination thereof) through the patterned mask layer to form openings (not shown), each extending through a corresponding one of the ILD features 92 and a corresponding one of the contact etching stop features 91 to expose a corresponding one of the source/drain features 70, (iii) forming a conductive material for forming the contact features 96 and then filling the openings using for example, but not limited to, ALD, CVD, plating, or other suitable techniques, and (iv) removing an excess of the conductive material for forming the contact features 96 to expose the self-aligned dielectric features 94 using CMP or other suitable techniques to form the contact features 96. In some embodiments, the conductive material for forming the contact features 96 may include, for example, but not limited to, W, cobalt (Co), Ru, Al, copper (Cu), palladium (Pd), nickel (Ni), platinum (Pt), a low resistivity metal constituent, or the like, or combinations thereof. Other suitable materials and/or processes for forming the contact features 96 are within the contemplated scope of the present disclosure.

After step 109, as shown in FIG. 15, the semiconductor structure 20 is thus formed. The remaining channel features 421B between two adjacent ones of the source/drain features 70 together constitute a channel structure. The pairs of the inner spacers 531 are alternatingly disposed with the channel features 421B along the Z direction, and the inner spacers 531 of each pair are disposed at two opposite sides of a corresponding one of the gate structures 93 in the X direction. The source/drain features 70 are disposed opposite to each other relative to the channel structure and a corresponding one of the gate structures 93 along the X direction. In some embodiments, the semiconductor structure 20 may further include a plurality of interconnect layers each including an inter-metal dielectric (IMD) feature (not shown) in which electrically conductive elements (not shown, for example, metal contacts, metal lines and/or metal vias) are formed so as to permit the contact features 96 to be electrically connected to external circuits through the electrically conductive elements. In some embodiments, the interconnect layers may be formed by a dual damascene process, a single damascene process, or other suitable back-end-of-line (BEOL) techniques.

In some embodiments, some steps in the method 100 may be modified, replaced, or eliminated without departure from the spirit and scope of the present disclosure.

In this disclosure, by making the outer surfaces of the inner spacers 531 to be nitrogen-rich (i.e., by forming the lateral nitrided portion 535 of each of the inner spacers 531), and by removing the nitrogen-introduced outer portion 512 of each of the gate spacers 51, the precursor for forming the source/drain features 70 tends to nucleate on such nitrogen-rich surfaces, thereby improving the quality of the resulting source/drain features 70.

In accordance with some embodiments of the present disclosure, a semiconductor structure includes a channel structure, a gate structure, two source/drain features, and a plurality of inner spacers. The channel structure includes a plurality of channel features which are spaced apart from each other. The gate structure is disposed to surround the channel features. The source/drain features are disposed at two opposite sides of the channel structure such that each of the channel features interconnects the source/drain features. Each of the inner spacers is disposed to separate the gate structure from a corresponding one of the source/drain features. Each of the inner spacers includes an inner spacer body and a lateral nitrided portion. The lateral nitrided portion is in direct contact with the corresponding one of the source/drain features and has a nitrogen content greater than that of the inner spacer body.

In accordance with some embodiments of the present disclosure, the nitrogen content of the lateral nitrided portion of each of the inner spacers ranges from 10 atomic % to 45 atomic %.

In accordance with some embodiments of the present disclosure, the lateral nitrided portion of each of the inner spacers includes silicon and nitrogen, and a ratio of nitrogen atoms to silicon atoms ranges from 0.33 to 1.5.

In accordance with some embodiments of the present disclosure, the nitrogen content of the lateral nitrided portion of each of the inner spacers is greater than a nitrogen content of each of the channel features.

In accordance with some embodiments of the present disclosure, the semiconductor structure further includes two bottom dielectric isolation layers which are respectively disposed underneath the source/drain features. Each of the bottom dielectric isolation layers includes an isolation body and an upper nitrided portion which is disposed over the isolation body, which is connected to a respective one of the source/drain features, and which has a nitrogen content greater than that of the isolation body.

In accordance with some embodiments of the present disclosure, the semiconductor structure further includes two gate spacers which are disposed over the channel structure and respectively at two opposite sides of the gate structure. Each of the gate spacers has a nitrogen content less than the nitrogen content of the lateral nitrided portion of each of the inner spacers.

In accordance with some embodiments of the present disclosure, the inner spacer body has a density lower than that of each of the hate spacers.

In accordance with some embodiments of the present disclosure, the inner spacer body of each of the inner spacers has a density ranging from 1.6 g/cm³ to 2.3 g/cm³.

In accordance with some embodiments of the present disclosure, a semiconductor structure includes a channel structure, a gate structure, a plurality pairs of inner spacers, and two source/drain features. The channel structure includes a plurality of channel features which are spaced apart from each other along a Z direction. The gate structure includes a gate feature disposed to surround the channel features, and a gate dielectric layer disposed to separate the gate feature from the channel features. The pairs of inner spacers are alternatingly disposed with the channel features along the Z direction. The inner spacers of each pair are disposed two opposite sides of the gate structure in an X direction transverse to the Z direction. Each of the inner spacers includes an inner spacer body and a lateral nitrided portion that has a nitrogen content greater than that of the inner spacer body. The inner spacer body is disposed between the gate structure and the lateral nitrided portion. The source/drain features are disposed opposite to each other relative to the channel structure and the gate structure along the X direction such that each of the channel features interconnects the source/drain features, and such that the lateral nitrided portions of each pair of the inner spacers are respectively in direct contact with the source/drain features.

In accordance with some embodiments of the present disclosure, the lateral nitrided portion of each of the inner spacers includes silicon and nitrogen. The nitrogen content of the lateral nitrided portion of each of the inner spacers ranges from 10 atomic % to 45 atomic %.

In accordance with some embodiments of the present disclosure, the semiconductor structure further includes two bottom dielectric isolation layers which are respectively disposed underneath the source/drain features. Each of the bottom dielectric isolation layers includes an isolation body and an upper nitrided portion which is connected between the isolation body and a corresponding one of the source/drain features, and which has a nitrogen content greater than that of the isolation body and that of the each of the channel features.

In accordance with some embodiments of the present disclosure, the semiconductor structure further includes two gate spacers which are disposed over the channel structure and at two opposite sides of the gate structure. Each of the gate spacers has a nitrogen content that is less than the nitrogen content of the lateral nitrided portion of each of the inner spacers and that is less than the nitrogen content of the upper nitrided portion of each of the bottom dielectric isolation layers.

In accordance with some embodiments of the present disclosure, the inner spacer body of each of the inner spacers has a density ranging from 1.6 g/cm³ to 2.3 g/cm³.

In accordance with some embodiments of the present disclosure, a method for manufacturing a semiconductor structure includes: forming a patterned stack portion including a plurality of channel features and a plurality of sacrificial features which are disposed to alternate with the channel features, each of the sacrificial features having a major portion and two end portions which are disposed at two opposite sides of the major portion; forming a plurality pair of inner spacers, each pair of which is formed by replacing the two end portions of a corresponding one of the sacrificial features, each of the inner spacers including a lateral portion and an inner spacer body disposed between the lateral portion and the major portion of a corresponding one of the sacrificial features; performing a treating process so as to convert the lateral portion of each of the inner spacers into a lateral nitrided portion which has a nitrogen content greater than that of the inner spacer body; and forming two source/drain features at two opposite sides of the patterned stack portion such that each of the channel features interconnects the source/drain features, and such that the lateral nitrided portions of each pair of the inner spacers are in direct contact with the source/drain features, respectively.

In accordance with some embodiments of the present disclosure, the treating process is a plasma process which introduces nitrogen into each of the inner spacers so as to convert the lateral portion of each of the inner spacers into the lateral nitrided portion.

In accordance with some embodiments of the present disclosure, the lateral nitrided portion of the each of the inner spacers has a first thickness. During introduction of the nitrogen into each of the inner spacers, the nitrogen is further introduced into two end portions of each of the channel features such that the two end portions of each of the channel features are converted into two nitrogen-introduced end portions which has a second thickness smaller than the first thickness. Before forming the source/drain features, the method further includes performing a removing process to remove the nitrogen-introduced end portions of each of the channel features, while the lateral nitrided portion of each of the inner spacers is partially retained.

In accordance with some embodiments of the present disclosure, the method further includes forming a dummy gate portion on the patterned stack portion; forming two gate spacers on the patterned stack portion and at two opposite sides of the dummy gate portion; and replacing the dummy gate portion and the major portions of the sacrificial features with a gate structure, after forming the source/drain features.

In accordance with some embodiments of the present disclosure, the lateral nitrided portion of the each of the inner spacers has a first thickness. During introduction of the nitrogen into each of the inner spacers, the nitrogen is further introduced into an outer portion of each of the gate spacers such that the outer portion of each of the gate spacers is converted into a nitrogen-introduced outer portion which has a third thickness smaller than the first thickness. Before forming the source/drain features, the method further comprises performing a removing process to remove the nitrogen-introduced outer portion of each of the gate spacers, while the lateral nitrided portion of each of the inner spacers is partially retained.

In accordance with some embodiments of the present disclosure, a ratio of the first thickness to the third thickness ranges from 1.2 to 10.

In accordance with some embodiments of the present disclosure, the method further includes forming two bottom dielectric isolation layers at two opposite sides of the patterned stack portion so as to permit the source/drain features to be respectively formed over the bottom dielectric isolation layers. During introduction of the nitrogen into each of the inner spacers, the nitrogen is further introduced into an upper portion of each of the bottom dielectric isolation layers such that the upper portion of each of the bottom dielectric isolation layers is converted into an upper nitrided portion which is in direct contact with a respective one of the source/drain features after formation of the source/drain features.

The foregoing outlines features of several embodiments so that those skilled in the art may better understand the aspects of the present disclosure. Those skilled in the art should appreciate that they may readily use the present disclosure as a basis for designing or modifying other processes or structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a semiconductor structure, comprising:
   forming a patterned stack portion including channel features and sacrificial features which are disposed to alternate with the channel features;
   replacing end portions of the sacrificial features with inner spacers, such that each of the inner spacers includes a lateral portion and an inner spacer body disposed between the lateral portion and a corresponding one of the sacrificial features;
   performing a treating process so as to convert the lateral portion of one of the inner spacers into a lateral nitrided portion which has a nitrogen content greater than a nitrogen content of the inner spacer body of the one of the inner spacers; and
   forming two source/drain features at two opposite sides of the patterned stack portion such that each of the channel features interconnects the two source/drain features, and such that the lateral nitrided portion of the one of the inner spacers interfaces a corresponding one of the two source/drain features,
   wherein
   the treating process is a process which introduces nitrogen into the one of the inner spacers so as to convert the lateral portion of the one of the inner spacers into the lateral nitrided portion which has a first thickness, and
   during introduction of the nitrogen into the one of the inner spacers, the nitrogen is further introduced into an end portion of one of the channel features such that the end portion of the one of the channel features is converted into a nitrogen-introduced end portion which has a second thickness smaller than the first thickness.

2. The method of claim 1, wherein the treating process is performed by a plasma process using a nitrogen-containing plasma.

3. The method of claim 1,
   further comprising: before forming the two source/drain features, performing a removing process to remove the nitrogen-introduced end portion of the one of the channel features, while the lateral nitrided portion of the one of the inner spacers is partially retained.

4. The method of claim 3, wherein, after the removing process, the nitrogen content of the lateral nitrided portion of the one of the inner spacers is greater than a nitrogen content of a remaining portion of the one of the channel features.

5. The method of claim 1, wherein the nitrogen content of the lateral nitrided portion of the one of the inner spacers ranges from 10 atomic % to 45 atomic %.

6. The method of claim 1, wherein the lateral nitrided portion of the one of the inner spacers includes silicon and nitrogen, a ratio of nitrogen atoms to silicon atoms ranging from 0.33 to 1.5.

7. The method of claim 1, wherein the inner spacer body of the one of the inner spacers has a density ranging from 1.6 $g/cm^3$ to 2.3 $g/cm^3$.

8. A method for manufacturing a semiconductor structure, comprising:
   forming a stack portion including a channel feature and a sacrificial feature disposed beneath the channel feature;
   forming a dummy gate portion on the stack portion;
   forming a gate spacer on the stack portion and at a side of the dummy gate portion;

patterning the stack portion to form a source/drain recess in the stack portion;

replacing an end portion of the sacrificial feature with an inner spacer through the source/drain recess;

treating the inner spacer and the gate spacer with a nitrogen-containing plasma to form a lateral nitrided portion in the inner spacer and a nitrogen-introduced outer portion in the gate spacer; and performing a removing process on the inner spacer and the gate spacer, such that the nitrogen-introduced outer portion of the gate spacer is removed, while the lateral nitrided portion of the inner spacer is partially retained.

9. The method of claim 8, wherein, before treating the inner spacer and the gate spacer, a density of the gate spacer is greater than a density of the inner spacer.

10. The method of claim 9, wherein, before treating the inner spacer and the gate spacer, a difference between the density of the gate spacer and the density of inner spacer is higher than 0.2 g/cm³.

11. The method of claim 8, wherein a first thickness of the lateral nitrided portion of the inner spacer is greater than a second thickness of the nitrogen-introduced outer portion of the gate spacer.

12. The method of claim 11, wherein a ratio of the first thickness to the second thickness ranges from 1.2 to 10.

13. The method of claim 8, wherein, after the removing process, a nitrogen content of the lateral nitrided portion of the inner spacer is greater than a nitrogen content of a remaining portion of the gate spacer.

14. The method of claim 8, after the removing process, further comprising:

growing a source/drain feature from the channel feature and the lateral nitrided portion of the inner spacer such that the source/drain feature fills the source/drain recess.

15. A method for manufacturing a semiconductor structure, comprising:

forming a stack portion on a base portion, the stack portion including a channel feature and a sacrificial feature which is disposed beneath the channel feature;

forming a dummy gate portion on the stack portion;

forming a gate spacer on the stack portion and at a side of the dummy gate portion;

patterning the stack portion to form a source/drain recess, thereby exposing the base portion;

replacing an end portion of the sacrificial feature with an inner spacer through the source/drain recess;

forming a dielectric isolation layer on the base portion, the dielectric isolation layer being located at a bottom of the source/drain recess;

performing a treating process on the inner spacer, the gate spacer and the dielectric isolation layer using a nitrogen-containing plasma to form a lateral nitrided portion in the inner spacer, a nitrogen-introduced outer portion in the gate spacer, and an upper nitrided portion in the dielectric isolation layer; and performing a removing process on the inner spacer, the gate spacer and the dielectric isolation layer, such that the nitrogen-introduced outer portion of the gate spacer is removed, while the lateral nitrided portion of the inner spacer and the upper nitrided portion of the dielectric isolation layer are partially retained.

16. The method of claim 15, wherein, after the treating process, the dielectric isolation layer has the upper nitrided portion and an isolation body which is disposed between the upper nitrided portion and the base portion, a nitrogen content of the upper nitrided portion being greater than a nitrogen content of the isolation body.

17. The method of claim 15, after the removing process, further comprising:

growing a source/drain feature from the channel feature, the lateral nitrided portion of the inner spacer, and the upper nitrided portion of the dielectric isolation layer such that the source/drain feature fills the source/drain recess.

18. The method of claim 15, wherein the dielectric isolation layer interfaces the inner spacer.

19. The method of claim 15, wherein a first thickness of the lateral nitrided portion of the inner spacer is greater than a second thickness of the upper nitrided portion of the dielectric isolation layer.

20. The method of claim 15, wherein, after the removing process, a nitrogen content of the upper nitrided portion of the dielectric isolation layer is greater than a nitrogen content of a remaining portion of the gate spacer.

* * * * *